United States Patent [19]

Bluzer

[11] Patent Number: 4,614,960

[45] Date of Patent: Sep. 30, 1986

[54] FOCAL PLANE ARRAY

[75] Inventor: Nathan Bluzer, Silver Spring, Md.

[73] Assignee: Westinghouse Electric Corp., Pittsburgh, Pa.

[21] Appl. No.: 514,340

[22] Filed: Jul. 15, 1983

[51] Int. Cl.[4] .................... H01L 29/78; H01L 27/14; H01L 31/00
[52] U.S. Cl. .......................... 357/24; 357/30
[58] Field of Search ............... 357/24, 24 LR

[56] References Cited

U.S. PATENT DOCUMENTS

| 3,858,232 | 12/1974 | Boyle et al. | 357/24 |
|---|---|---|---|
| 3,903,542 | 9/1975 | Nathanson et al. | 357/24 |
| 3,909,925 | 10/1975 | Forbes et al. | 357/24 |
| 3,947,863 | 3/1976 | Powell | 357/24 |
| 4,001,861 | 1/1977 | Carnes | 357/24 |
| 4,142,198 | 2/1979 | Finnila et al. | 357/24 |
| 4,197,633 | 4/1980 | Lorenze, Jr. et al. | 357/24 |
| 4,228,365 | 10/1980 | Gutierrez et al. | 357/24 |
| 4,231,149 | 11/1980 | Chapman et al. | 357/24 |
| 4,273,596 | 7/1981 | Gutierrez et al. | 357/24 |
| 4,286,278 | 8/1981 | Lorenze, Jr. et al. | 357/24 |
| 4,356,040 | 10/1982 | Fu et al. | |

OTHER PUBLICATIONS

Foss et al., "Threshold Variation Effects in IR Detector/CCD Focal Planes", *Joint Meeting of the IRIS Specialty Groups on Infrared Detectors and Imaging (U)*, vol. I, Jun. 13-15, 1978, pp. 115-130, C1-C4.

Kosonocky et al., "Two Phase Charge-Coupled Devices with Overlapping Polysilicon and Aluminum Gates", RCA Review, vol. 34, Mar. 1973, pp. 164-202.

*Primary Examiner*—Andrew J. James
*Assistant Examiner*—R. P. Limanek
*Attorney, Agent, or Firm*—W. G. Sutcliff

[57] ABSTRACT

A focal plane array, comprised of an infrared (IR) photovoltaic detector array coupled to a charge coupled device (CCD), which provides for minimum deviation in input threshold voltage between individual detector input nodes of the array is disclosed. In one embodiment, an oxide nitride dielectric layer overlays the entire CCD with the exception of the areas beneath the direct injection gates where only a thin oxide dielectric is formed. In another embodiment, the oxide beneath the direct injection gates is substantially thinner than the oxide beneath the remainder of the CCD structure.

5 Claims, 7 Drawing Figures

FOCAL PLANE ARRAY

BACKGROUND OF THE INVENTION

Recently developed thermal imaging systems typically include (IR) detectors coupled to a (CCD) by way of a direct injection method. A multitude of these detectors and input gates together with their respective charge coupled devices (CCD) form a device commonly known as a focal plane array. In response to thermal radiation, the (IR) detectors in the array, each produce a photo current signal which is applied to a respective source node of the direct injection input structure to which each detector is connected. The source's node input impedance and the internal shunting resistance across each IR photodetector, share the detector's photocurrent and act as a sink for such a photocurrent. When the voltage applied to the direct injection gate reaches a certain value referred to as a threshold value, photocurrent begins to flow into the CCD through the source input node of the direct injection structure. The bias voltage required across each IR detector is small, and is equal to the difference between the voltages applied to the direct injection gate minus the threshold voltage ($V_T$), and minus the voltage applied to detector nodes not connected to the input source node. In large focal plane arrays the direct injection input gates are all tied to a common control line; and those detector nodes which are not connected to the input source node are coupled to a common control line. For a large number of detectors coupled to a CCD, the bias voltage developed across each detector is a direct function of the threshold voltage associated with the particular direct injection structure to which the detectors are connected. The difficulty in maintaining a uniform threshold value increases substantially with array size. In the event that a uniform threshold value is not maintained within certain limits, the focal plane array responds, such that those direct injection structures with the lowest threshold value "turn on" first, and the direct injection structures with the higher threshold voltage value, remain "off". Upon further increase, a sufficient voltage will be applied to the common direct injection gate to "turn on" all injection structures. This results in some detectors being biased above the value desired for proper operation. Thus, some CCD potential wells may be saturated as a result of the extra bias applied across some IR detectors before other detectors are sufficiently biased, for "turning on" and inject photocurrent into their respective input structure. This saturation, of course, is deleterious to the operation of the array, including the possible loss of signal information on the entire output channel.

Recent studies indicate that the control of threshold uniformity may be obtained by controlling the uniformity of certain process variables in the manufacture of CCD devices. Uniformity of the oxide thickness and the density variation of the interface state between the substrate and the overlying oxide layer, have a substantial affect on threshold uniformity of a focal plane array.

In one exemplary process, the gate oxide thickness ($t_{ox}$) averaged 1130 Angstroms; and the deviation in oxide thickness of such a layer was from 5 Angstroms within each wafer to 15 Angstroms within each run of wafers, and 34 Angstroms between different runs. This deviation in oxide thickness resulted in a deviation of approximately 23 millivolts across a single 2½ inch wafer, a deviation of 40 millivolts between wafers within a single run, and a deviation of 165 millivolts between individual process runs. With respect to the deviations in interface state density ($N_{ss}$) between the substrate and the oxide layer, a recent analysis indicates that the interface state density contributes a deviation of 17.5 millivolts to threshold uniformity while uniformity of the oxide thickness contributes only 4½ millivolts deviation to the threshold voltage.

The remaining process variables, such as deviation in oxide charger ($Q_o$), implant doping ($N_I$) for adjusting the threshold level, deviations of the doping level of the polysilicon gate ($N_\epsilon$), and doping level deviations of the substrate ($N_B$) all affect threshold uniformity, but to a much lesser extent. In summary, as the process parameters vary in a focal plane array, the threshold voltages vary from one detector to another. A more detailed explanation of threshold variation effects in IR detector/CCD focal plane arrays is included in a publication prepared for the Office of Naval Research in Arlington, VA, by the Environmental Research Institute of Michigan, dated August 1978.

Heretofore, in an attempt to obtain threshold voltage uniformity, input circuits were designed with a feedback loop for the purpose of realizing uniform threshold input gate voltages, at the expense of a substantially larger cell size, and a more complex focal plane array. Improved threshold control through improved uniformity of the process variables, particularly the gate oxide thickness and interface state density, which cause the greatest deviation in threshold voltage, at the present time, is impractical to obtain.

Therefore, it is desirable to provide an improved CCD focal plane array that exhibits substantial uniformity in its threshold voltage values across the entire array without the necessity of attempting to establish and/or develop a high degree of uniformity in the process variables.

SUMMARY OF THE INVENTION

In accordance with the present invention, there is provided an improved CCD focal plane array, comprised of commonly connected photosensitive detectors and input gates. The focal plane CCD's to which the detectors are coupled are arranged in rows and columns on a single substrate. The substrate of the array has adjacent one surface thereof a plurality of implants or diffusions, of a conductivity type opposite that of the substrate, each of which is in contact with the input node of a respective photosensitive detector. The implant is selected in accordance with the desired threshold voltage value. A dielectric layer overlays the said one surface of the substrate, in which the direct injection gate structures and potential well structures used for photocurrent integration are located.

In accordance with my invention, threshold voltage uniformity is obtained by providing a thin gate oxide in the area beneath the direct injection gates. Since the thinness of such layer would ordinarily cause dielectric breakdown during clocking operation at normally higher voltages the gate dielectric layer has an increased thickness over the remaining area of the substrate, and CCD. Thus, thickness of the dielectric layer is much less in that portion of the array beneath the input or direct injection gates, and thicker in the portion of the substrate overlying the implant and within the CCD gate regions and the potential wells.

The thinner portion of the dielectric layer has a thickness dimension large enough to prevent tunneling current in the array, but small enough to provide the substantial threshold uniformity in accordance with the invention. The thicker portion of the dielectric layer is of a conventional thickness thereby minimizing breakdown of the dielectric during CCD operation, but thin enough to provide the desired capacity of the potential well.

In one embodiment, the thickness dimension of the dielectric layer is increased by a nitride layer overlying the thin oxide layer and that portion of the CCD that is not beneath the direct injection gates. In another embodiment, the oxide layer is graded to be thicker in that portion of the CCD not beneath the direct injection gates. Either embodiment of the invention may utilize a polysilicon or a metal gate.

DESCRIPTION OF THE PREFERRED EMBODIMENTS

Figure 1:
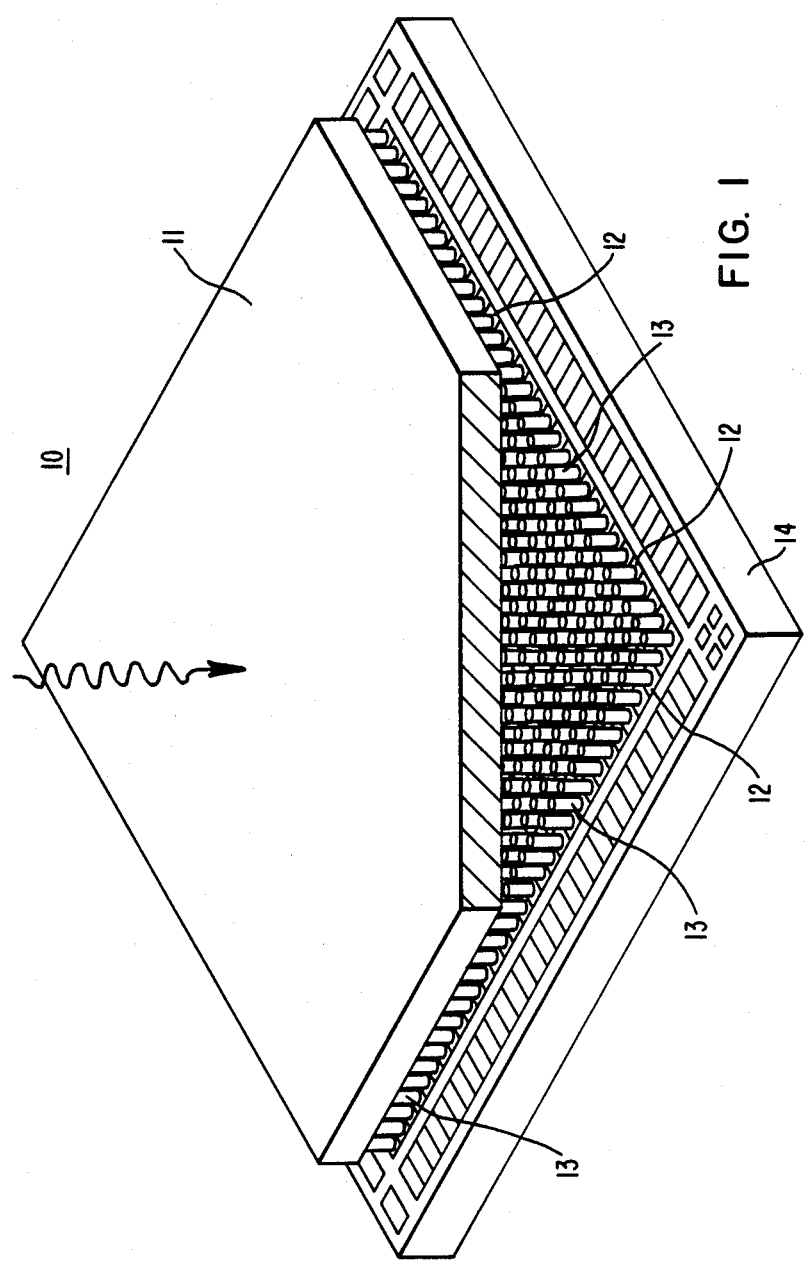
FIG. 1 is a three dimensional view of a focal plane array with a portion of the detector broken away to illustrate the arrangement of the CCD unit cells of the present invention.
Figure 2:
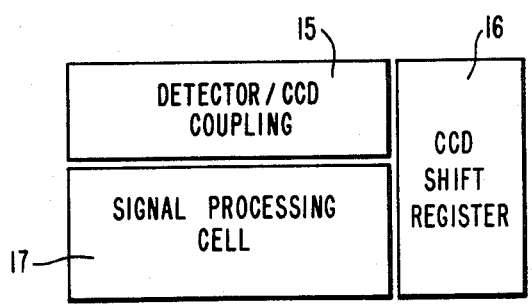
FIG. 2 is a schematic block diagram to illustrate the three portions of a CCD unit cell.

Referring to FIG. 1, a focal plane array 10 includes a detector array 11 made from an infrared (IR) detector material, such as mercury cadmium telluride. The individual detectors are formed in rows and columns in the single solid detection piece 11, as is well known in the art. One node of the detector array 11 is common to all of the detectors; and the other node of each detector of the array is coupled to a respective CCD unit cell referred to at 12, preferably by an indium member or bump 13. The CCD unit cells 12 are each formed in rows and columns in a block of material such as silicon, for example, referred to at 14. The indium bumps 13 interconnect the individual detectors to a detector/CCD coupling of portion 15 of each unit cell 12 (see FIG. 2) which also includes a CCD shift register 16 and a signal processing portion 17.

Figure 3:
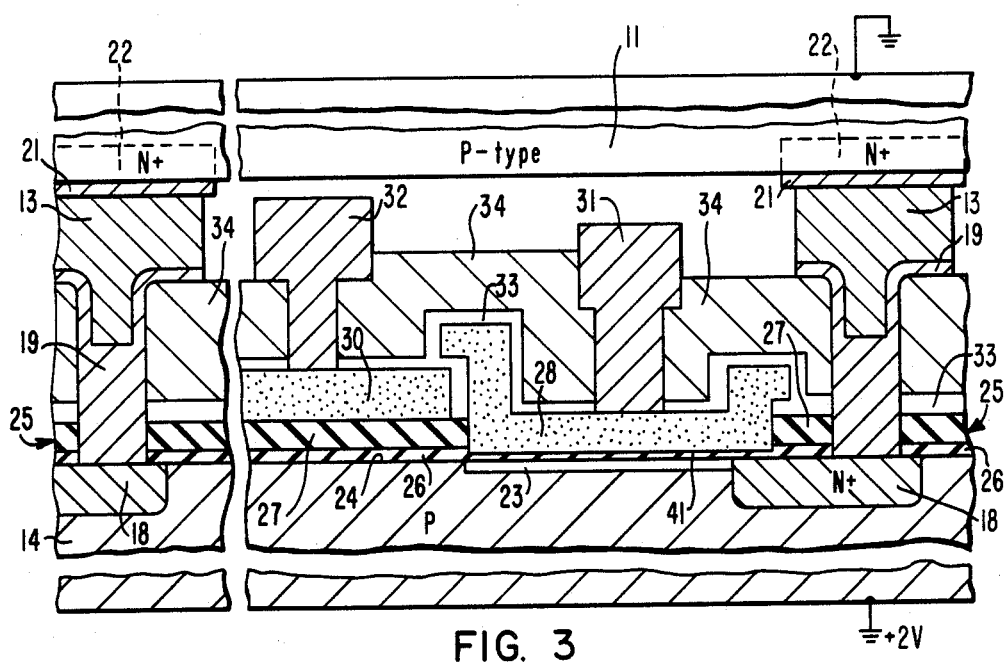
FIG. 3 is a highly magnified fragmentary sectional view of an MNOS CCD unit cell structure of a focal plane array according to the present invention, having polysilicon gates.

Referring to FIG. 3, the silicon substrate 14 of the focal plane array 10 of FIG. 1 may be of a P type conductivity and has a diffusion portion 18 of a conductivity type opposite that of the substrate 14, which in the present example is N+, that serves as an input source node for coupling with the IR detector.

A metallic interconnect 19 engages and electrically contacts the indium bump 13 to the diffusion 18 at one end and electrically contacts the detector 22 through the interconnects 21. An implant portion 23 formed in the silicon substrate 14 is of P conductivity type and its doping concentration determines the actual threshold voltage. The doped portion 18 is exposed at, what may be called for the sake of convenience, an upper or inner surface 24 of the substrate 14 as viewed in the drawings.

Overlying the inner surface 24 of the entire substrate 14 is a dielectric layer 25, which in the embodiment of FIG. 3, is comprised of an oxide portion 26 and a nitride portion 27. The nitride portion overlays the portion 26 in all areas of the surface 24, except those beneath the input or direct injection gates 28. The total thickness of the dielectric layer 25, comprised of the oxide and nitride layers 26 and 27, may be anywhere from approximately 1000 to 2000 Angstroms in thickness, while those areas of the dielectric layer, namely the oxide layer portion 26 beneath the direct injection gates 28, is approximately 100 to 200 Angstroms thick in accordance with the present embodiment of the invention.

A polysilicon gate 30 overlays the nitride portion 27 of the dielectric layer 25, which is an integration potential well gate, and is respresentative of all gates other than the direct injection gates of each of the CCD unit cells 12 in the silicon block or substrate 14. Metallic terminals 31 and 32 are in ohmic contact with the polysilicon gates 30 and 28 respectively.

Typically, during operation, the voltage applied to the direct injection gate terminal 31 is positive relative to the anode potential of the detectors 11 to effect approximately +20 millivolts across the IR detector diode N+ referred to at 22 by having a voltage on the direct injection gate 28 sufficiently above the input structure's threshold voltage so that the potential on the input diffusion 18 is 20 millivolts above the anode potential of the diode 11. The polysilicon gates 30 and 28 are oxidized and covered by an oxide layer 33, which is approximately 2000 Angstroms in thickness. A protective coating of silicon dioxide 34 formed by chemical vapor deposition overlays the oxidized polysilicon layer 33, and is approximately 7000 Angstroms in thickness. The metal terminals 31 and 32 are preferably of aluminum.

Figure 4:
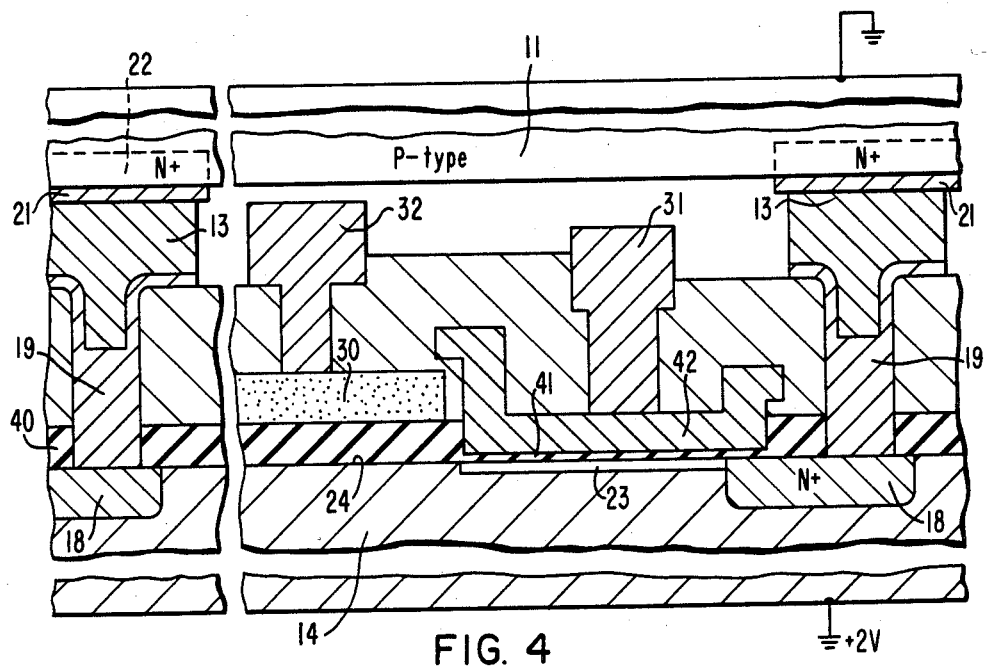
FIG. 4 is a highly magnified fragmentary sectional view of an MOS CCD unit cell structure of a focal plane array according to another embodiment of the present invention, having metallic gates.

The embodiment of FIG. 4, which shows also the magnified fragmentary portion of a CCD unit cell structure, bears reference numerals similar to those in FIG. 3 for like portions. A dielectric layer 40, that is comprised of an oxide layer having a thin portion 41, overlays the portion of the implant 23 below a metallic direct injection gate 42. Instead of providing a nitride layer to increase the thickness of the dielectric layer beyond the area of the input gates, as described in connection with FIG. 3, the oxide layer 40 is from 1000 to 2000 Angstroms in thickness. The thin portion 41 of the oxide layer 40 is from approximately 100 to 200 Angstroms in thickness similar to FIG. 3. The direct injection metallic gate 42 may be of any suitable metal that does not react with the dielectric layer 40, such as gold, silver, or platinum, for example.

Figure 5:
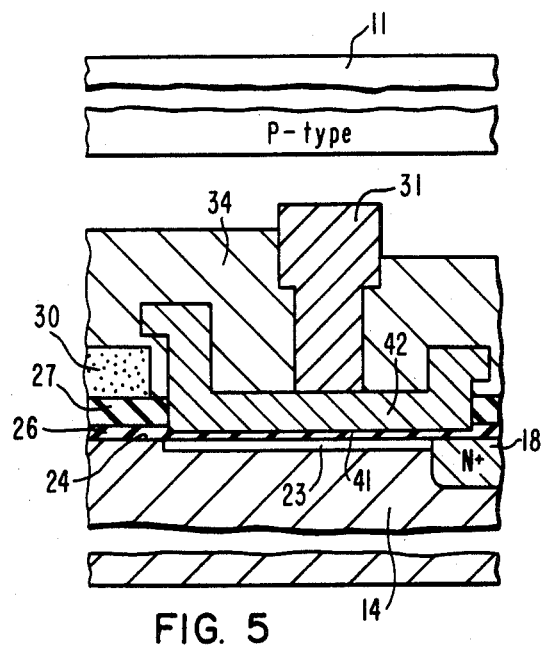
FIG. 5 is a highly magnified fragmentary sectional view of the embodiment of FIG. 3, with metallic gates.
Figure 6:
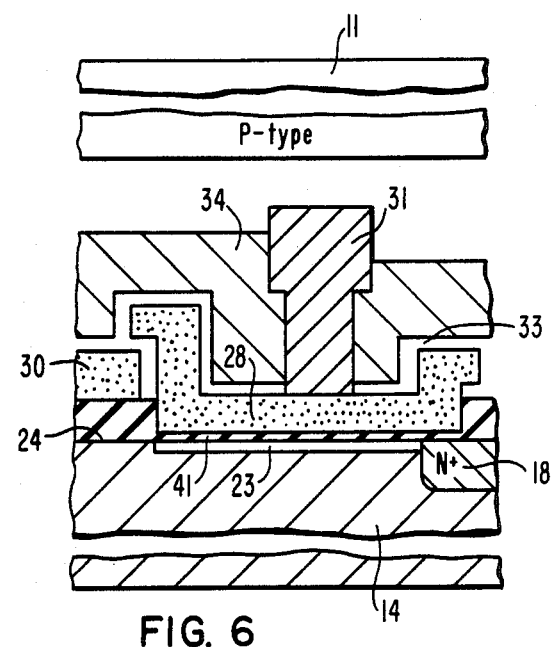
FIG. 6 is a highly magnified fragmentary sectional view of the embodiment of FIG. 4 with polysilicon gates.

FIG. 5, which bears the same reference numerals for like parts as FIGS. 3 and 4, is similar to FIG. 3 except that it includes the metallic direct injection gate 42. FIG. 6 also bears similar reference numerals for like parts and is similar to the embodiment of FIG. 4, except that it includes the polysilicon direct injection gates 28.

In the manufacture of a focal plane array in accordance with the present invention, conventional well-known processes may be utilized; and the differential in thickness of the dielectric layer overlaying the substrate 14 may be effected in the following manner. For example, in the embodiment that includes a polysilicon direct injection gate 28, the nitride/oxide layer 27 and 26 may be first formed over the surface 24 of the entire substrate 14 and be of uniform thickness throughout. The entire oxide/nitride layer 26 and 27 is removed in those areas beneath the direct injection gate 28 and a thin oxide layer 26 of approximately 100 Angstroms is grown in such areas before the deposition of the polysilicon gate 28. Plasma etching may be used to remove the nitride/oxide dielectric layer 27 and 26 beneath the direct injection gate 28 in order to prevent undercutting of the edge oxide on the polysilicon gate 30. In order to prevent short circuiting between the polysilicon gate 30 and the polysilicon gate 28, the oxide grown around the polysilicon layer 30 is substantially thicker than the oxide layer 26. As mentioned, plasma etching is preferably used to anisotropically remove the nitride/oxide layer 27 and 26 beneath the direct injection gate 28 without significantly laterally thinning the 2000 Angstrom dielectric layer 33 between the polysilicon gate 30 and the subsequently formed polysilicon gate 28. Then, reoxidation of the entire structure 14, during the process of growing the 100 Angstrom oxide layer 41 beneath the polysilicon layer 28 before it is formed, will reduce the occurrence of electrical shorts. When using a metal gate such as 42, care should be exercised in order to limit, if not eliminate, subsequent high temperature processing to preclude interaction between such metal gate 42 and the thin oxide layer 41. The layer 41 beneath the direct injection gates is not necessarily identical in thickness to the layer 26.

The oxide layer 41 beneath the direct injection gates of the CCD unit cells of the focal plane array is preferably in the order of 100 Angstroms to obtain optimum uniformity of the threshold voltages of the focal plane array. In any event, such oxide layer may be thicker, e.g. 200 Angstroms thick, or as little as 80 Angstroms to obtain beneficial results. An oxide layer that is too thin permits tunneling current through the layer that severely limits its usefulness.

The 100 Angstroms oxide layer beneath the direction injection gate is, of course, insufficient in thickness to prevent dielectric breakdown of the CCD during typically higher voltage clocking operation. My discovery of utilizing such a thin oxide layer beneath direct injection gates only, is made practical by increasing the thickness of the oxide layer in all other areas of the CCD, which prevents dielectic breakdown. In the MNOS embodiment, the dielectric breakdown is prevented by eliminating the nitride layer beneath the direct injection gates, only.

Figure 7:
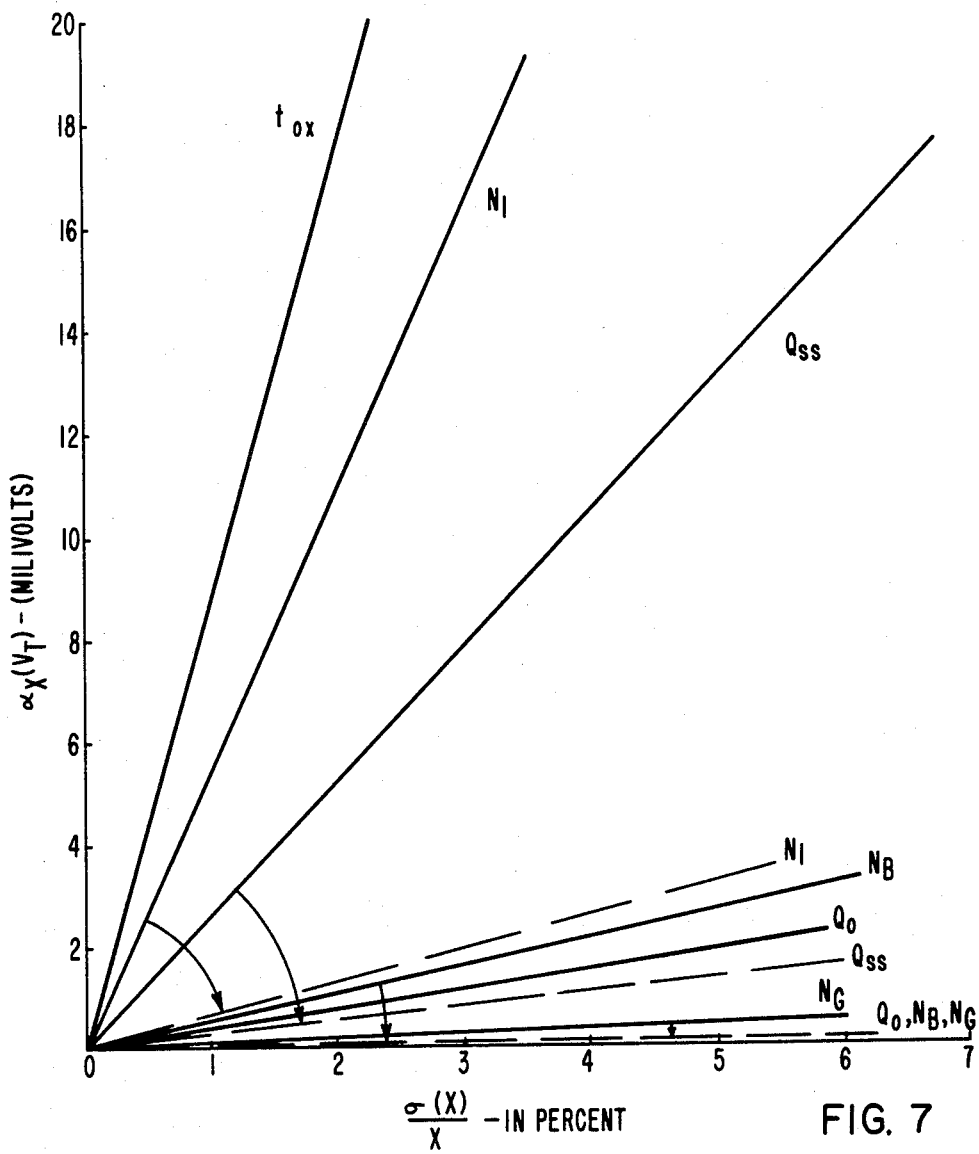
FIG. 7 is a graph to illustrate that with a thin oxide beneath the direct injection gate according to the present invention, the contribution of various process parameter variations to threshold voltage uniformity is minimized.

Justification for my discovery can be demonstrated by the following extensive analysis which is described in connection with FIG. 7.

The solution for achieving good threshold control is based on extensive analysis of the contributions to fluctuations in MIS structures. The rationale and analysis justifying the approach selected is obtained from a statistical analysis of the threshold voltage in terms of the standard deviations (S.D.) of the parameters determining the threshold voltage.

The general equation for the threshold voltage of an n-channel MOSFET with a Si-polygate is given by:

$$V_T = -\phi_{ms} - \left(\frac{Q_{ss} + Q_o}{\epsilon_{ox}}\right) t_{ox} + \phi(inv) + \left(\frac{Q_B}{\epsilon_{ox}}\right) t_{ox} \quad (1)$$

where:

$t_{ox}$ is the oxide thickness, $\phi_{ms}$ is the metal to substrate work function, $Q_{ss}$ and $Q_o$ are the interface state charges and the oxide's fixed charge densities respectively, $Q_B$ is the charge induced in Si with a surface potential $\phi(inv)$, and $\phi(inv)$ is the contribution to the threshold voltage ($V_T$) due to band bending at inversion. $\phi(inv)$ is taken to be equal to $2\Psi_B = 2(E_F - E_i)$. The threshold voltage may be rewritten as:

$$V_T = -kT\ln\left(\frac{N_G(N_I + N_B)}{n_i^2}\right) - \left(\frac{Q_{ss} + Q_o}{\epsilon_{ox}}\right) t_{ox} + 2kT\ln\left(\frac{N_I + N_B}{n_i}\right) + \left[4kT\epsilon_{si}(N_I + N_B)\ln\left(\frac{N_I + N_B}{n_i}\right)\right]^{\frac{1}{2}} \left(\frac{t_{ox}}{\epsilon_{ox}}\right) \quad (2)$$

where:

$N_G$ is the polygate doping level, $N_I$ is implant doping level (introduced for threshold control) $n_i$ is the intrinsic carrier concentration and, $Q_{ss}$ and $Q_o$ are the interface state charge and oxide fixed charge densities, respectively $t_{ox}$ is the oxide thickness $\epsilon_{ox}$ is the oxide dielectric constant $\epsilon_s$ is the Si dielectric constant k is Boltzmann's constant T is the temperature $n_i$ is the intrinsic carrier concentration in the Si substrate $N_I$ is the implant doping level $N_B$ is the substrate doping level q is the electron charge $$2\psi_B = 2kT\ln\left(\frac{N_I + N_B}{n_i}\right) \quad (3)$$

$$Q_B = \left(4kT\epsilon_{si}(N_I + N_B)\ln\left(\frac{N_I + N_B}{n_i}\right)\right)^{\frac{1}{2}} \quad (4)$$

An expression for the standard deviation of the threshold voltage may be obtained by rewriting each parameter, $t_{ox}$, $Q_{ss}$, etc. in terms of the sum of the average value and its statistical fluctuations. Incorporating this substitution in equation (2) and using a Taylor's series expression, the standard deviation for the MOS threshold voltage, $\sigma(V_T)$ can be expressed as:

$$\sigma^2(V_T) = \sigma^2_{N_I}(V_T) + \sigma^2_{N_B}(V_T) + \sigma^2_{N_G}(V_T) + \sigma^2_{t_{ox}}(V_T) + \sigma^2_{Q_{ss}}(V_T) + \sigma^2_{Q_o}(V_T) \quad (5)$$

where:

$$\sigma_{N_I}(V_T) = \left(\frac{kT}{q} + \frac{t_{ox}Q_B}{2\epsilon_{ox}}\right)\left(\frac{1}{N_I + N_B}\right)\sigma(N_I) \quad (6)$$

$$\sigma_{N_B}(V_T) = \left(\frac{kT}{q} + \frac{t_{ox}Q_B}{2\epsilon_{ox}}\right)\left(\frac{1}{N_I + N_B}\right)\sigma(N_B)$$

$$\sigma_{N_G}(V_T) = \frac{kT}{q}\left(\frac{1}{N_G}\right)\sigma(N_G)$$

$$\sigma_{t_{ox}}(V_T) = \frac{Q_{ss} + Q_o - Q_B}{\epsilon_{ox}}\sigma(t_{ox})$$

$$\sigma_{Q_{ss}}(V_T) = \frac{t_{ox}}{\epsilon_{ox}}\sigma(Q_{ss})$$

$$\sigma_{Q_o}(V_T) = \frac{t_{ox}}{\epsilon_{ox}}\sigma(Q_o)$$

The terms $\sigma(N_I)$, $\sigma(t_{ox})$, etc. are the standard deviations of each of the variables, and the terms $\sigma_{N_I}(V_T)$, $\sigma_{ox}(V_T)$, etc. represents the contribution of each variable to $\sigma(V_T)$. A plot of the contributions each variable $N_I$, $t_{ox}$, etc. make to $\sigma(V_T)$ is shown in FIG. 7 obtained using the average process values listed in Table I and equation (6). For convenience, the graph is plotted as a function of the normalize variables $\sigma(t_{ox})/t_{ox}$ etc. For the case shown, $\sigma(V_T)$ is most sensitive to percentage variations in $t_{ox}$, $N_I$, and $Q_{ss}$ respectively. Using the standard deviation values listed in Table I we compute the contributions of the various terms in equation (6) to be:

| | |
|---|---|
| $\sigma_{N_B}(V_T) = 1.08$ mV | $\sigma_{Q_o}(V_T) = 1.85$ mV |
| $\sigma_{t_{ox}}(V_T) = 4.5$ mV | $\sigma_{N_G}(V_T) = 0.06$ mV |
| $\sigma_{Q_{ss}}(V_T) = 17.5$ mV | $\sigma_{N_I}(V_T) = 2.73$ mV |

The threshold voltage standard deviation $\sigma(V_T)$ calculated with these values and equation (5) is 18.3 mV.

These equations have been shown to correspond well to experimental results. Using similar device parameter values, experimental results were measured on an MOS at 300K to yield measured values of $\sigma(V_T)$ of 33 mV as compared with calculated values of 23 mV.

TABLE I

MOS PROCESS PARAMETER VALUES
T = 77K

| Parameters | Average Process Values | Within Wafer $\sigma_i$ | $\frac{\sigma_i}{\langle X_i \rangle}$ in % |
|---|---|---|---|
| Gate Oxide Thickness ($t_{ox}$) | 1000 Angstroms | 5 Angstroms | 0.5 |
| Substrate Doping ($N_B$) | $6.0 \times 10^{14}$ cm$^{-3}$ | $1.1 \times 10^{13}$ cm$^{-2}$ | 1.8 |
| $Q_{ss}$ | $6 \times 10^{10}$ cm$^{-2}$ | $0.4 \times 10^{10}$ cm$^{-2}$ | 6.7 |
| $Q_o$ | $8 \times 10^9$ cm$^{-2}$ | $0.4 \times 10^9$ cm$^{-2}$ | 5 |
| Poly Doping ($N_G$) | $6.3 \times 10^{19}$ cm$^{-3}$ | $0.3 \times 10^{19}$ cm$^{-3}$ | 4.8 |
| Implant Doping ($N_I$) | $6.0 \times 10^{15}$ cm$^{-3}$ | $7.5 \times 10^{13}$ cm$^{-3}$ | 0.5 |

The use of a thin oxide ($\leq 100$ Angstroms) MOS approach produces a threshold voltage with a standard deviation well within the limits of 10 mV. Improved threshold control is realized with the thin oxide approach without the need for severe process improvements. Reducing the $t_{ox} \leq 100$ Angstroms, reduces severely the contributions from terms other than $t_{ox}$ to $\sigma(V_T)$. Specifically, the reduction occurs because the value of $t_{ox}$ enters directly into equation (6) and reducing $t_{ox}$ from 1000 Angstroms to 100 Angstroms severely reduces the contribution from $\sigma(N_I)$, $\sigma(N_B)$, $\sigma(Q_{ss})$ and $\sigma(Q_o)$ to the threshold voltage variance. The effect of thinning on threshold control is illustrated in FIG. 7. Contributions to the threshold voltages $\sigma_X(V_T)$ from a given variable X can be obtained directly locating on the abscissa the percentage value corresponding to the $\sigma(X)/X$ ratio and reading off the $\sigma_X(V_T)$ value with a curve labeled by the X variables. The solid curves in FIG. 7 are for the 1000 Angstroms oxide while the dashed curves are for the 100 A oxide. Hence for the same abscissa values for variables $N_I$, $Q_{ss}$, $Q_o$, $N_B$ and $N_G$ the contribution to $\sigma(V_T)$ are severely reduced from the solid curves in FIG. 7 to the dashed curves. This is illustrates in FIG. 7 by the curve slopes which decrease wih descrasing oxide thickness. The solid curves are replaced by those dashed curves that are connected by an arc. Numerically, the results of thinning are:

| | |
|---|---|
| $\sigma_{t_{ox}}(V_T) = 4.5$ mV | $\sigma_{N_I}(V_T) = 0.34$ mV |
| $\sigma_{Q_{ss}}(V_T) = 1.8$ mV | $\sigma_{Q_o}(V_T) = 0.12$ mV |
| $\sigma_{N_B}(V_T) = 0.13$ mV | $\sigma_{N_G}(V_T) = 0.06$ mV |

The root mean square sum of these values gives $\sigma(V_T) = 5.0$ mV. Clearly significant improvements have been realized by thinning the oxide from 1000 Angstroms to 100 Angstroms, i.e. $\sigma(V_T)$ is reduced from 18.3 mV to 5.0 mV. However the contributions from oxide thickness variations have not been reduced and this is graphically represented in FIG. 1 by having a single solid curve labeled $t_{ox}$.

It is important to note that with the thinner oxide $\sigma(V_T)$ fluctuations due to $Q_{ss}$, $Q_o$, $N_B$, $N_I$ and $N_G$ become relatively insignificant and the main contributions rest with oxide thickness fluctuations.

What I claim is:

1. In a focal plane array having a plurality of commonly connected photodetectors and a plurality of charge coupled devices (CCD's) arranged in rows and columns coupled to respective detectors, each of said CCD's including transfer and direct injection input gates overlaying an inner surface of a semiconductive substrate facing the detectors, each of said input gates being commonly connected for the application of a bias voltage during operation, and whereby photocurrent commences to flow into each CCD upon the application of a voltage of minimum threshold value to its respective input gate, the improvement of a dielectric layer having first portions sandwiched between the inner surface of the substrate and opposing surfaces of each of the input gates, said dielectric layer having second portions sandwiched between the inner surface of the substrate and opposing surfaces of the transfer gates, said sandwiched first portions directly beneath each of the input gates being of a thickness between approximately 80 and 200 Angstroms to improve the uniformity of the threshold voltage between individual input gates, said sandwiched second portions directly beneath the transfer gates being thicker than the portions directly beneath each of the input gates, said second portions being of sufficient thickness to prevent dielectric breakdown of the dielectric during clocking operation of the CCD.

2. The improvement of claim 1 wherein the first and second portions of the layer are oxide.

3. The improvement of claim 1 wherein the first layer portions are oxide and the second layer portions are oxide having an overlay of nitride.

4. The improvement of claim 1 wherein the input gates are metallic.

5. The improvement of claim 1 wherein the input gates are polysilicon.

* * * * *